United States Patent
Zhu et al.

(10) Patent No.: US 10,305,273 B2
(45) Date of Patent: May 28, 2019

(54) PHOTOVOLTAIC SYSTEM AND RAPID SHUTDOWN METHOD THEREOF

(71) Applicant: Delta Electronics (Shanghai) CO., LTD, Shanghai (CN)

(72) Inventors: Xuancai Zhu, Shanghai (CN); Jianming Chen, Shanghai (CN); Bingwen Weng, Shanghai (CN); Zhiying Zhao, Shanghai (CN)

(73) Assignee: Delta Electronics (Shanghai) CO., LTD, Shanghai (CN)

( * ) Notice: Subject to any disclaimer, the term of this patent is extended or adjusted under 35 U.S.C. 154(b) by 161 days.

(21) Appl. No.: 15/402,322

(22) Filed: Jan. 10, 2017

(65) Prior Publication Data

US 2017/0207620 A1     Jul. 20, 2017

(30) Foreign Application Priority Data

Jan. 18, 2016    (CN) .......................... 2016 1 0031672

(51) Int. Cl.
*H02H 7/122* (2006.01)
*H02S 40/32* (2014.01)
(Continued)

(52) U.S. Cl.
CPC ....... *H02H 7/122* (2013.01); *H01L 31/02021* (2013.01); *H02H 3/20* (2013.01);
(Continued)

(58) Field of Classification Search
USPC .................................................. 136/206, 244
See application file for complete search history.

(56) References Cited

U.S. PATENT DOCUMENTS

| 8,860,242 B1 | 10/2014 | Pruett et al. |
| 2015/0061409 A1 | 3/2015 | Dunton et al. |

(Continued)

FOREIGN PATENT DOCUMENTS

| CN | 102611133 A | 7/2012 |
| CN | 203278261 U | 11/2013 |

(Continued)

OTHER PUBLICATIONS

«IEEE Transactions on Consumer Electronics» vol. 61, No. 2.
The CN1OA dated Feb. 25, 2019 by the CNIPA.

*Primary Examiner* — Danny Nguyen
(74) *Attorney, Agent, or Firm* — Yunling Ren (57) ABSTRACT

Disclosed are a photovoltaic system and its rapid shutdown method. The photovoltaic system includes a photovoltaic array including a photovoltaic array panel and a shutdown device, a junction box and an inverter, the shutdown device is electrically connected to the photovoltaic array panel and is connected to the inverter; the photovoltaic system further includes a shutdown device controller, which is coupled to the high voltage wires, and is configured for receiving a first detection signal reflecting a state of the AC side of the inverter, determining whether the AC side of the inverter is in a power-off state, outputting a first power-off signal when the AC side of the inverter is in the power-off state, and transferring the first power-off signal to the shutdown device; and the shutdown device receives the first power-off signal and prohibits the electric energy from transferring to the inverter.

12 Claims, 8 Drawing Sheets

(51) Int. Cl.
*H02S 40/34* (2014.01)
*H02H 3/20* (2006.01)
*H02S 50/00* (2014.01)
*H01L 31/02* (2006.01)
*H02H 3/30* (2006.01)
*H02J 3/38* (2006.01)

(52) U.S. Cl.
CPC .............. *H02S 40/32* (2014.12); *H02S 40/34* (2014.12); *H02S 50/00* (2013.01); *H02H 3/305* (2013.01); *H02J 3/383* (2013.01); *Y02E 10/563* (2013.01)

(56) References Cited

U.S. PATENT DOCUMENTS

2017/0271875 A1* 9/2017 Narla ..................... H02J 3/383
2017/0373610 A1* 12/2017 White ..................... H02J 3/383

FOREIGN PATENT DOCUMENTS

| CN | 103703647 A | 4/2014 |
| CN | 103858303 A | 6/2014 |
| CN | 204651939 U | 9/2015 |
| JP | 2012205061 A | 10/2012 |
| JP | 2016001948 A | 1/2016 |
| WO | 2010078303 A2 | 7/2010 |

* cited by examiner

PHOTOVOLTAIC SYSTEM AND RAPID SHUTDOWN METHOD THEREOF

CROSS REFERENCE

This application is based upon and claims priority to Chinese Patent Application No. 201610031672.8, filed on Jan. 18, 2016, the entire contents thereof are incorporated herein by reference.

TECHNICAL FIELD

The present disclosure relates to the field of solar photovoltaic, and more particularly, to a photovoltaic system and its rapid shutdown method.

BACKGROUND

Nowadays power generation from solar energy, i.e., photovoltaic generation, is widely applied domestic and overseas. The grid-connected type of the photovoltaic system mainly includes a photovoltaic array, a junction box, an inverter, and etc. In US, PV system circuits installed on or in buildings shall include a rapid shutdown function to reduce shock hazard for emergency responders in accordance with NEC (National Electrical Code), article 690.12.

In the conventional grid-connected type of the photovoltaic system, a rapid shutdown device may be present between the photovoltaic array and the inverter, so as to avoid increasing the difficulty to the rescuers, even making a threat to the life safety of the rescuers, due to breakage and leakage of input wires of the photovoltaic array caused by the emergency accidents.

Figure 1:
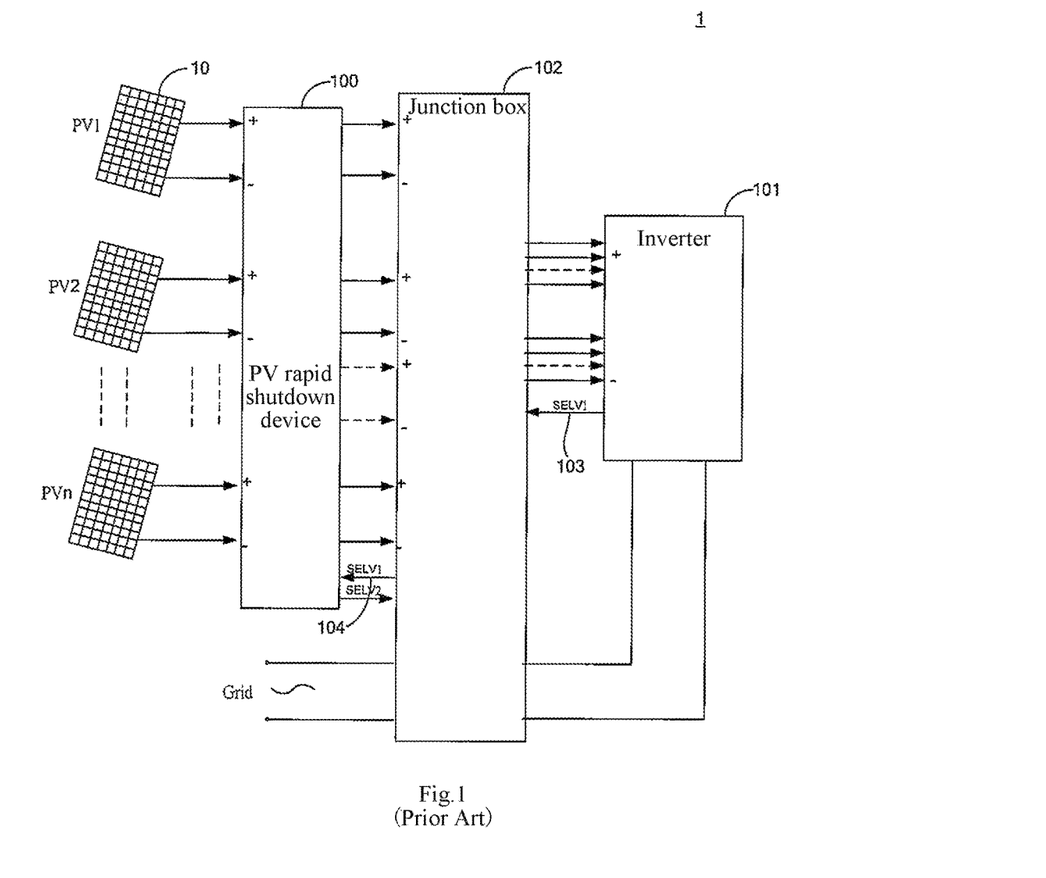
FIG. 1 is a structural schematic diagram of a photovoltaic system in the related art.

FIG. 1 is a structural schematic diagram of a photovoltaic system. As shown in FIG. 1, the photovoltaic system 1 includes a photovoltaic array 10, a PV shutdown device 100, a junction box 102 and an inverter 101. The photovoltaic array 10 converts the solar energy into DC electrical energy, and transfers the DC electrical energy to the inverter 101 via high voltage wires. The inverter 101 converts the DC power to AC power and deliver it to the installed wire. The junction box 102 is used for configuring lead wires at an input side and an output side of the inverter 101. The PV shutdown device 100 is used for disconnecting the high voltage wire from the photovoltaic array 10 and the junction box 102 when shut down action is initiated, such that the photovoltaic array 10 and the inverter 101 are disconnected.

In the photovoltaic system 1 shown in FIG. 1, a plurality of photovoltaic arrays 10 share a same PV shutdown device 100, such that the same one PV shutdown device 100 controls a shutdown and a closure of a plurality of high voltage wires between the plurality of photovoltaic arrays 10 and the junction box 102. As shown in FIG. 1, one signal wire 103 is laid between the junction box and the inverter, and when shut down action is initiated, the inverter 101 transfers the control signal to the junction box via the signal wire 103. A signal wire 104 is drawn out from the junction box to the PV shutdown device, and the junction box outputs the control signal SELV1 to the PV shutdown device via the signal wire 104, so as to control the shutdown of the PV shutdown device. However, since the rapid shutdown device itself has lead wires for all DC high voltage outputted by the photovoltaic arrays, it is difficult to ensure the requirement that a distance between the PV photovoltaic arrays and the rapid shutdown device can meet the requirement of National Electrical Code (NEC).

Figure 2:
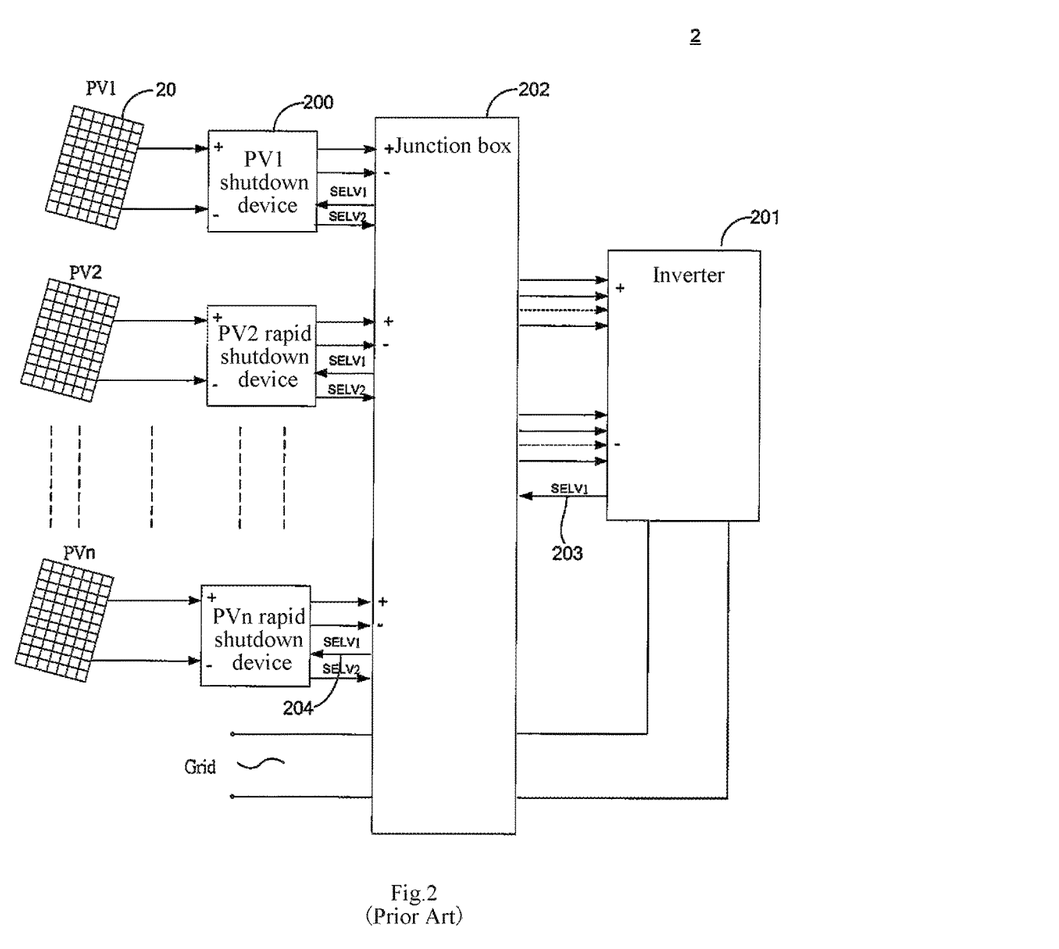
FIG. 2 is a structural schematic diagram of another photovoltaic system in the related art.

FIG. 2 is a structural schematic diagram of another photovoltaic system. As shown in FIG. 2, the photovoltaic system 2 includes a photovoltaic array 20, a PV shutdown device 200, a junction box 202 and an inverter 201. As compared with FIG. 1, in FIG. 2, each photovoltaic array 20 and the junction box 202 are installed with one PV shutdown device 200. As shown in FIG. 2, one signal wire 203 is laid between the junction box and the inverter, and when shut down action is initiated, the inverter 201 transfers the control signal to the junction box via the signal wire 203. The junction box draws out a signal wire 204 to each PV shutdown device, and the control signal is output to the PV shutdown device so as to control the shutdown of each PV shutdown device.

No matter what kind of the above-mentioned photovoltaic system is, the difficulty and complexity of installing the system will increase.

Meanwhile, with respect to the provisions about PV Rapid shutdown Systems in UL 1741 CRD, it is required that the rapid shutdown device has a self-test functionality, and one self-test is carried out periodically, and when the self-test is not passed, an obvious instruction or an alarm sound is necessary to achieve a warning function. In order to satisfy the principle that the rapid shutdown device is as close to a PV panel of the photovoltaic array as possible, such warning function is generally implemented in a body of the inverter or in the junction box. With the shutdown device mentioned before, it is hard to achieve as there is no communication between the shutdown device and inverter or the accessory. To achieve this, it is necessary to add more connection between the shutdown device on the roof nearby the PV array and inverter or accessory, this will increase the system cost and complexity.

SUMMARY

With respect to the problems existing in the related art, the purpose of the present disclosure is to provide a photovoltaic system and its shutdown method, which can reduce the installing difficulty and complexity of the photovoltaic system.

To achieve the above-mentioned purpose, the photovoltaic system of the present disclosure includes at least a photovoltaic array, a junction box and an inverter, the photovoltaic array transfers electric energy to a DC side of the inverter via a high voltage wires, an AC side of the inverter is coupled to a power grid, and the junction box is connected to the inverter for configuring an input lead wire and an output lead wire of the inverter, the photovoltaic array includes the photovoltaic panels and a shutdown device, the shutdown device is electrically connected to the photovoltaic panels and is connected to the inverter via the high voltage wires;

the photovoltaic system further includes a shutdown device controller, which is coupled to the high voltage wires, and is configured for receiving a first detection signal reflecting a state of the AC side of the inverter, determining whether the AC side of the inverter is in a power-off state according to the first detection signal, outputting a first power-off signal when the AC side of the inverter is in the power-off state, and transferring the first power-off signal to the at least a photovoltaic array via the high voltage wires; and the shutdown device of the photovoltaic array is configured for receiving the first power-off signal, and prohibiting the electric energy from transferring to the inverter according to the first power-off signal.

The present disclosure also provides a method for shutting down a photovoltaic system, the photovoltaic system including at least one photovoltaic array panel unit, a junction box and an inverter, and the photovoltaic array including a photovoltaic array panel and a shutdown device, the method includes:

detecting whether a AC side of the inverter is in a power-off state according to a first detection signal;

when the AC side of the inverter is in the power-off state, outputting a first power-off signal and transferring the first power-off signal to the at least one photovoltaic array via a high voltage wires; and     prohibiting electric energy from transferring to the inverter by controlling an action of the shutdown device according to the first power-off signal.

Further, prohibiting electric energy from transferring to the inverter by controlling the action of the shutdown device according to the first power-off signal includes:

filtering a low frequency component of the first power-off signal to generate a third power-off signal; and     generating a shutdown control signal according to the third power-off signal to control the action of the shutdown device according to the shutdown control signal so as to prohibit the electric energy from transferring to the inverter.

In the present disclosure, the high voltage wires in the photovoltaic system are utilized to transfer communication control signals between the shutdown device and the inverter, thereby it is unnecessary to additionally arrange a communication control signal wire between the shutdown device and the inverter, which reduces the installing difficulty and complexity of the photovoltaic system.

BRIEF DESCRIPTION OF THE DRAWINGS

Various objects, features and advantages of the present disclosure will be more obvious by considering the detailed description of the embodiments of the present disclosure in combination with the drawings. The drawings are only exemplary diagrams of the present disclosure, and are not necessarily plotted in proportion. In the drawings, the same reference signs always indicate the same or similar components.

DETAILED DESCRIPTION

Hereinafter, the exemplary embodiments will be fully described by referring to the drawings. However, the exemplary embodiments may be implemented in various forms, and it should not interpret that the embodiments are limited to the embodiments explained herein; on the contrary, the embodiments are provided for making the present disclosure entire and complete, and transferring the concept of the exemplary embodiments to the person skilled in the art entirely. In the drawings, the same reference signs indicate the same or similar structures, and thus the detailed description thereof will be omitted.

Figure 3:
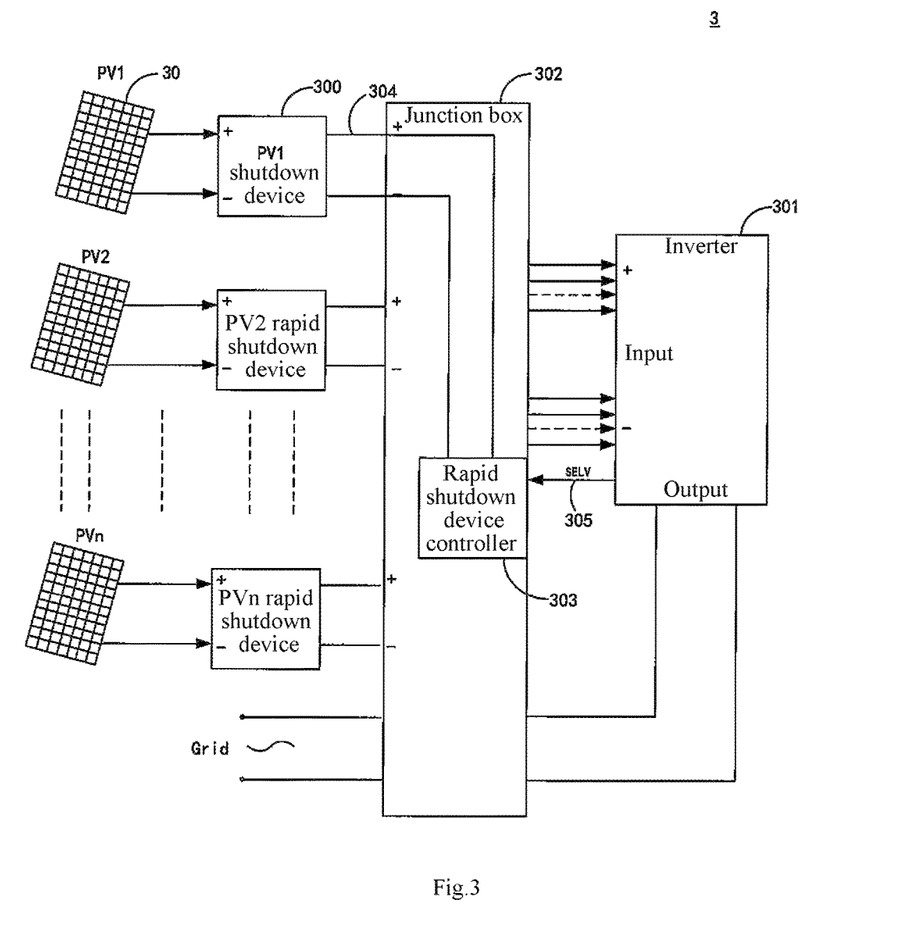
FIG. 3 is a structural schematic diagram of a photovoltaic system according to an embodiment of the present disclosure.

FIG. 3 is a structural schematic diagram of a photovoltaic system according to an embodiment of the present disclosure. As shown in FIG. 3, the photovoltaic system 3 includes a photovoltaic array 30, a PV shutdown device 300, a junction box 302 and an inverter 301. The junction box 302 is installed near the inverter 301 for configuring lead wires at an input side and an output side of the inverter 301. The PV shutdown device 300 is installed on high voltage wires between the photovoltaic array 30 and the junction box 302, and is as close to the photovoltaic array 30 as possible. The photovoltaic array 30 transfers electric energy to a DC side of the inverter 301 via the high voltage wires, and an AC side of the inverter 301 is coupled to a power grid or directly supplies power to the user. The junction box 302 is electrically connected with the inverter 301 for configuring an input lead wire and an output lead wire of the inverter 301, the junction box 302 accesses the high voltage wires 304 and is electrically connected to the input side of the inverter; the junction box 302 is also electrically connected to the output side of the inverter and accesses the power grid. The photovoltaic system 3 further includes a shutdown device controller 303. The shutdown device controller 303 is coupled to the high voltage wires 304 for receiving a first detection signal SELV reflecting a state of the AC side of the inverter 301, determining whether the AC side of the inverter 301 is in a power-down state according to the first detection signal SELV, and outputting a first power-off signal to the PV shutdown device 300 via the high voltage wires 304 when the AC side of the inverter 301 is in the power-down state. The first power-off signal includes an electrical signal with a carrier frequency of Power Line Communication (PLC), e.g. 220 KHz-235 KHz or 72 KHz-85 KHz, but the frequency of the first power-off signal in the present disclosure is not limited thereto. The PV shutdown device receives the first power-off signal, and prohibits transferring the DC energy from the photovoltaic array 30 to the inverter 301 according to the first power-off signal.

In the present embodiment, a power-off control signal for controlling the shutdown of the PV shutdown device can be transmitted via the high voltage wires. In this way, the low voltage control signal wire between the junction box and the PV rapid shutdown device can be saved, and the laying of wires for the low voltage control signal and an isolation treatment between the high voltage and the low voltage can be directly saved, which greatly simplifies the laying manner of the wires, and makes the entire wire system more safe and reliable.

Figure 4:
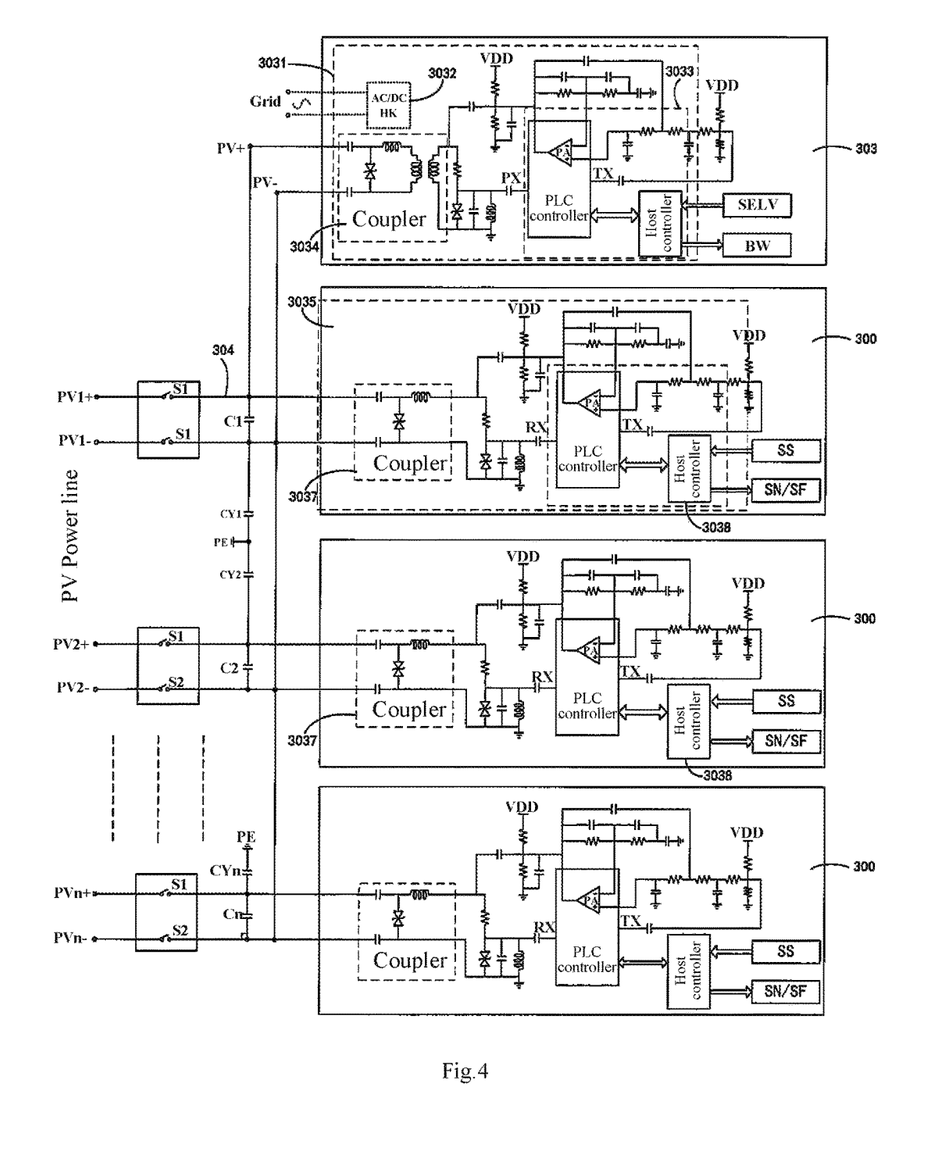
FIG. 4 is a schematic diagram of a signal transmission principle between a rapid shutdown device and a shutdown controller of the photovoltaic system of the present disclosure.

FIG. 4 is a structural schematic diagram of a rapid shutdown device and a shutdown controller of the photovoltaic system according to an embodiment of the present disclosure.

As shown in FIG. 4, the shutdown device controller 303 includes a first signal terminal and a first communication device 3031. Signal wire 305 is laid between the shutdown device controller 303 and the inverter 301, and an input terminal of the first signal terminal is connected to the signal wire 305 and receives a first detection signal SELV reflecting a state of the AC side of the inverter 301. The first communication device 3031 is electrically connected to the first signal terminal, determines whether the AC side of the inverter 301 is in a power-down state according to the first detection signal SELV, outputs a first power-off signal when the AC side is in the power-down state, and loads the first power-off signal on the high voltage wires for transmission. The first communication device 3031 may include a first auxiliary power supply 3032, a first communication controller 3033, and a first coupler 3034. An input terminal of the first auxiliary power supply 3032 is connected to the power grid, and an output of the first auxiliary power supply 3032 supplies DC voltage to the first communication controller 3033 and the first coupler 3034. The first communication controller 3033 may include a PLC controller and a Host controller, or may be one digital controller, which is not limited by the present disclosure. The Host controller receives the first detection signal SELV reflecting the state of the AC side of the inverter 301 which is transferred from the first signal terminal. The Host controller determines whether the AC side of the inverter is powered down according to the first detection signal SELV, and outputs a first fault signal to the PLC controller when the Host controller determines that the AC side of the inverter is powered down according to the first detection signal SELV. The PLC controller receives the first fault signal and sends a high frequency current signal from its TX terminal to a power amplifier PA inside the PLC controller and peripheral circuits of the PLC controller, such as circuits (including a plurality of resistors, a plurality of capacitors and the like) from TX to the coupler in FIG. 4. The peripheral circuits of the PLC controller and the power amplifier inside the PLC controller are combined to perform a low pass filtering function and an amplifying function, and through the treatment of the peripheral circuits of the PLC controller and the power amplifier inside the PLC controller, the high frequency current signal is converted into a second power-off signal and is then outputted to an input terminal of the first coupler 3034. The input terminal of the first coupler 3034 receives the second power-off signal, filters out a low frequency component in the second power-off signal, and outputs the first power-off signal to load the first power-off signal carried with the fault information onto the high voltage wires 304. The first coupler 3034 mainly functions as a low pass filter for filtering out the low frequency component in the second power-off signal, and may be constituted by capacitors, resistors, and so on. In some circumstances needing isolation, the first coupler 3034 further includes an isolation device, for example, a transformer is adopted to achieve the isolation as shown in FIG. 4.

When an emergency accident happens, such as a natural disaster or a sudden accident, the rescuer may cut off the voltage on the AC side of the inverter, at this time, the first detection signal SELV changes, and the Host controller may determine whether the AC side is powered down according to the first detection signal SELV. The first detection signal SELV may be, for example, a voltage at the grid side of the inverter or a DC voltage outputted from the first auxiliary power supply 3032, but is not limited thereto. When the first detection signal SELV is the DC voltage outputted from the first auxiliary power supply 3032, the Host controller compares the DC voltage outputted from the first auxiliary power supply 3032 with a first set value, and if the DC voltage is less than the first set value, it means that the AC side is powered down. When the first detection signal SELV is the voltage at the AC side of the inverter, the Host controller compares the voltage at the AC side of the inverter with a second set value, and if the voltage at the AC side is less than the second set value, it indicates that the AC side is powered down. In general, the set value is 70% of a rating value, for example, an output of the first auxiliary power supply 3032 during normal operation is 5V, then when the outputted DC voltage reduces to 3.5V, it indicates that the power grid (AC side) is powered down. The above first/second preset value is only illustrative, and the present disclosure is not limited thereto, instead, the first/second preset value may be adjusted according to the actual needs.

Figure 5:
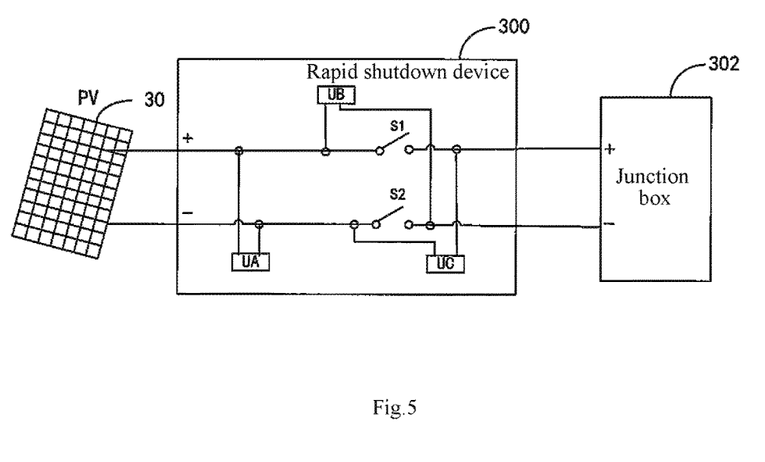
FIG. 5 is a structural schematic diagram of the shutdown device of the photovoltaic system of the present disclosure.

As shown in FIGS. 4 and 5, the PV shutdown device 300 includes a second signal terminal, a second communication device 3035, and second switching elements S1, S2. An input terminal of the second signal terminal is connected to the high voltage wires for receiving the first power-off signal loaded on the high voltage wires. The second communication device 3035 is connected to an output terminal of the second signal terminal for outputting a shutdown control signal according to the first power-off signal. The second communication device 3035 includes a second coupler 3037 and a second communication controller 3038. An input terminal of the second coupler 3037 is electrically connected to the output terminal of the second signal terminal for filtering a low frequency component of the first power-off signal and outputting a third power-off signal with a frequency consistent with that of the first power-off signal. The second communication controller 3038 may include a PLC controller and a Host controller, or may be one controller, and the present disclosure is not limited thereto. The RX terminal of the PLC controller receives the third power-off signal, converts the third power-off signal into a corresponding digital signal and sends it to the Host controller, then the Host controller converts the corresponding digital signal into an analog shutdown control signal SF so as to control the shutdown of the second switching elements S1, S2.

High frequency capacitors C1-Cn are installed among the high voltage wires 304, and filter the low frequency components of the first power-off signals loaded on the high voltage wires 304 together with the second coupler 3037. In addition, high frequency capacitors CY1-CYn are also installed between the high voltage wires 304 and a ground PE for conducting EMI. The capacitors CY1-CYn may be parasitic parameters of the circuit per se, such as a parasitic capacitance between the PV panel and the ground. The capacitors CY1-CYn may also be additional capacitors. As shown in FIG. 4, the shutdown device controller 303 loads the first power-off signal onto the high voltage wires 304, and the rapid shutdown device 300 on the high voltage wires corresponding to the photovoltaic array PV1 receives the first power-off signal and performs the above treatments to the first power-off signal. Meanwhile, the rapid shutdown devices 300 on the high voltage wires corresponding to the other photovoltaic arrays PV2 . . . PVn may receive the first power-off signal or a signal relevant to the first power-off signal via a coupling action between the above high frequency capacitors C1-Cn and the high frequency capacitors CY1-CYn, and then perform the above treatments, so as to be able to control the turn-on and turn-off of the plurality of PV shutdown devices in the photovoltaic system. In this way, when the AC side of the inverter is in the power-down state, only one shutdown device controller 303 may be needed to control the turn-off of the multi-path rapid shutdown device, thereby simplifying the number of the wirings of the system.

FIG. 5 is a structural schematic diagram of a second switching element in the PV shutdown device of the photovoltaic system according to an embodiment of the present disclosure. As shown in FIG. 5, the PV shutdown device 300 includes second switching elements S1, S2, and the second switching elements S1, S2 are respectively installed at two high voltage wires between the photovoltaic array panel 30 and the junction box 302. Control terminals of the second switching elements S1, S2 receive an Off/On control signal SF/SN outputted from the HOST controller, so as to control the turn-off or turn-on of the second switching elements S1, S2. For example, when the AC side of the inverter is powered down, the HOST controller of the second communication device 3035 outputs a shutdown control signal SF to shut down the second switching elements S1, S2, so as to disconnect the photovoltaic array panel 30 from the junction box 302, and then disconnect the photovoltaic array panel 30 from the inverter 301, thereby avoiding more damage caused by the photovoltaic panel with high voltage and high energy, and protecting the personnel in charge of rescue.

The PV shutdown device 300 also includes a self-test unit for detecting whether the second switching elements S1, S2 can normally turn on or turn off, so as to avoid the misoperation of the system due to that the second switching elements S1, S2 cannot normally turn on or turn off. In combination with FIGS. 4 and 5, the PV shutdown device 300 detects the states of the second switching elements S1, S2, and in case of the second switching elements S1, S2 are abnormal, sends the fault information to the inverter 301 and the personnel by the signal transmission among the high voltage wires, the PV shutdown device and the shutdown device controller. The detailed condition is as follows: the HOST controller of the second communication controller 3038 receives a state signal SS indicating the states of the second switching elements S1, S2, and determines whether the second switching elements S1, S2 are in a fault state according to the state signal SS. When the HOST controller detects that the second switching elements S1, S2 are in the fault state, the HOST controller of the second communication controller 3038 outputs a second fault signal to the PLC controller. The PLC controller outputs an alarm signal via the TX terminal, a power amplifier PA inside the PLC controller and peripheral circuits of the PLC controller. The second coupler 3037 filters, or isolates and filters the alarm signal, outputs a first alarm signal, and loads it on the high voltage wires. The first alarm signal passes through the first coupler 3034 and the first communication controller 3033, and then the HOST controller of the first communication controller 3033 sends a second alarm signal to an outside alarm so as to control the outside alarm to alert. In the present embodiment, the self-test function of the self-test unit may be implemented via the programming by the HOST controller, but the present disclosure is not limited thereto.

The self-test unit includes a first voltage detection unit UA, a second voltage detection unit UB and a third voltage detection unit UC, a first terminal and a second terminal of the first voltage detection unit UA are respectively coupled to the high voltage wires between the photovoltaic array panel 30 and the second switching elements S1, S2; a first terminal of the second voltage detection unit UB is coupled to the high voltage wires between the photovoltaic array panel 30 and the second switching element S1, and a second terminal of the second voltage detection unit UB is coupled to the high voltage wires between the second switching element S2 and the junction box 302; a first terminal of the third voltage detection unit UC is coupled to the high voltage wires between the photovoltaic array panel 30 and the second switching element S2, and a second terminal of the third voltage detection unit UC is coupled to the high voltage wires between the second switching element S1 and the junction box 302. In the present disclosure, the self-test of the second switching elements S1, S2 is implemented by the voltages detected by the first voltage detection unit UA, the second voltage detection unit UB and the third voltage detection unit UC. When performing detection during a closed state of the switching elements, if the voltages detected by the first voltage detection unit UA and the second voltage detection unit UB are different, it is determined that the second switching element S2 is not reliably closed and is in the fault state; and if the voltages detected by the first voltage detection unit UA and the third voltage detection unit UC are different, it is determined that the second switching element S1 is not reliably closed and is in the fault state. Similarly, when performing detection during the turn-off state of the switching elements, if the voltages detected by the first voltage detection unit UA and the second voltage detection unit UB are the same, it is determined that the second switching element S2 is not reliably turned off and is in the fault state; and if the voltages detected by the first voltage detection unit UA and the third voltage detection unit UC are the same, it is determined that the second switching element S1 is not reliably turned off and is in the fault state.

Figure 6:
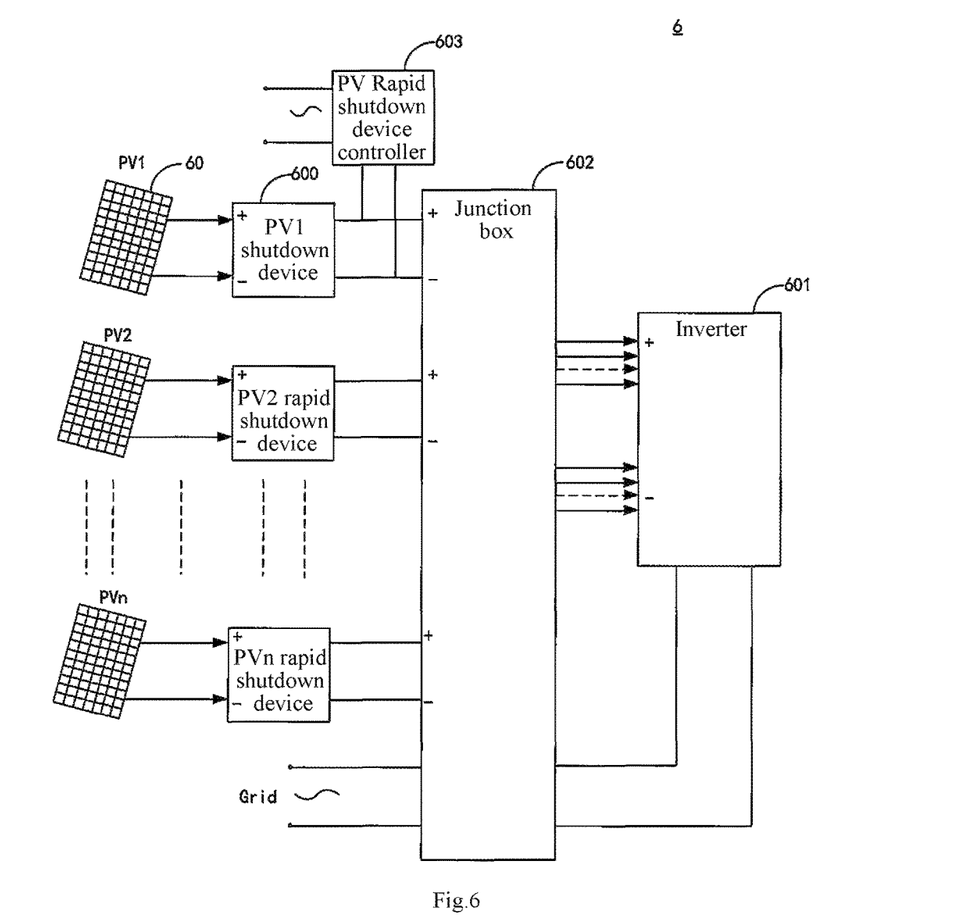
FIG. 6 is a structural schematic diagram of a photovoltaic system according to another embodiment of the present disclosure.

FIG. 6 is a structural schematic diagram of a photovoltaic system according to another embodiment of the present disclosure.

As shown in FIG. 6, the photovoltaic system 6 includes a photovoltaic array 60, a PV shutdown device 600, a shutdown device controller 603, a junction box 602 and an inverter 601. Compared with the photovoltaic system in FIG. 3, in the present embodiment, the shutdown device controller 603 is installed outside the junction box 602, but is still coupled to the high voltage wires. In such structure, it is unnecessary to draw one signal wire from the inverter to the junction box, thereby the wiring is simple. The first detection signal SELV may be an output voltage of the first auxiliary power supply 3032, and whether the AC side of the inverter is powered down is determined by comparing the DC voltage outputted from the first auxiliary power supply 3032 and a first set value. In the present embodiment, the structures of the shutdown device controller 603 and the shutdown device 600 are the same as those in the embodiment of FIG. 3, and are not elaborated herein.

The structure of the photovoltaic system in the method for shutting down the photovoltaic system in the present disclosure has been described in detail in the above embodiments, and each step in the shutdown method is introduced hereinafter.

Figure 7A:
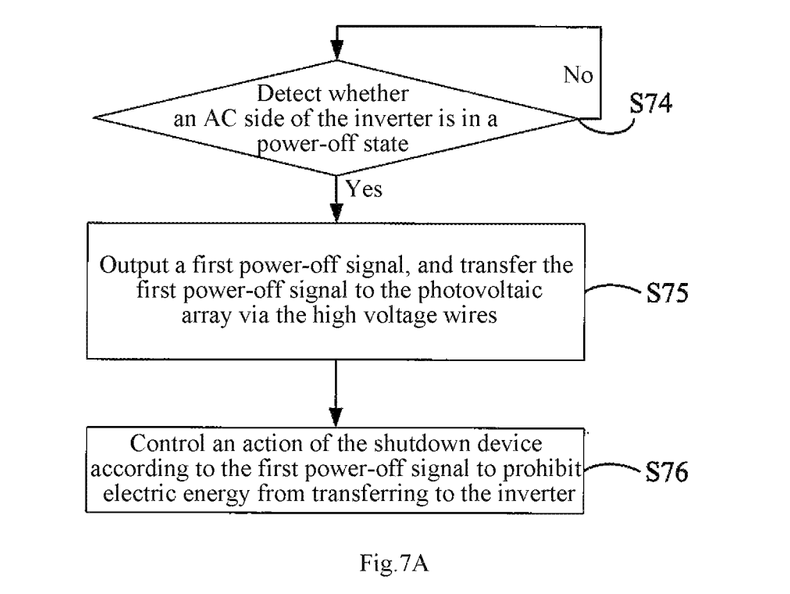
FIG. 7A is a flow chart of a method for shutting down the photovoltaic system according to an embodiment of the present disclosure.

FIG. 7A is a flow chart of a method for shutting down the photovoltaic system according to an embodiment of the present disclosure.

As shown in FIG. 7A, in step S74, whether an AC side of the inverter is in a power-off state is detected according to a first detection signal. When it is detected that the AC side of the inverter is not in the power-off state, the process returns to step S74 to maintain the state of the AC side of the inverter; and when it is detected that the AC side of the inverter is in the power-off state, the process proceeds to step S75.

In step S75, when the AC side of the inverter is in the power-off state, a first power-off signal is outputted, and the first power-off signal is transferred to the at least a photovoltaic array unit via a high voltage wires.

In step S76, electrical energy is prohibited from transferring to the inverter by controlling an action of the shutdown device according to the first power-off signal.

Figure 7B:
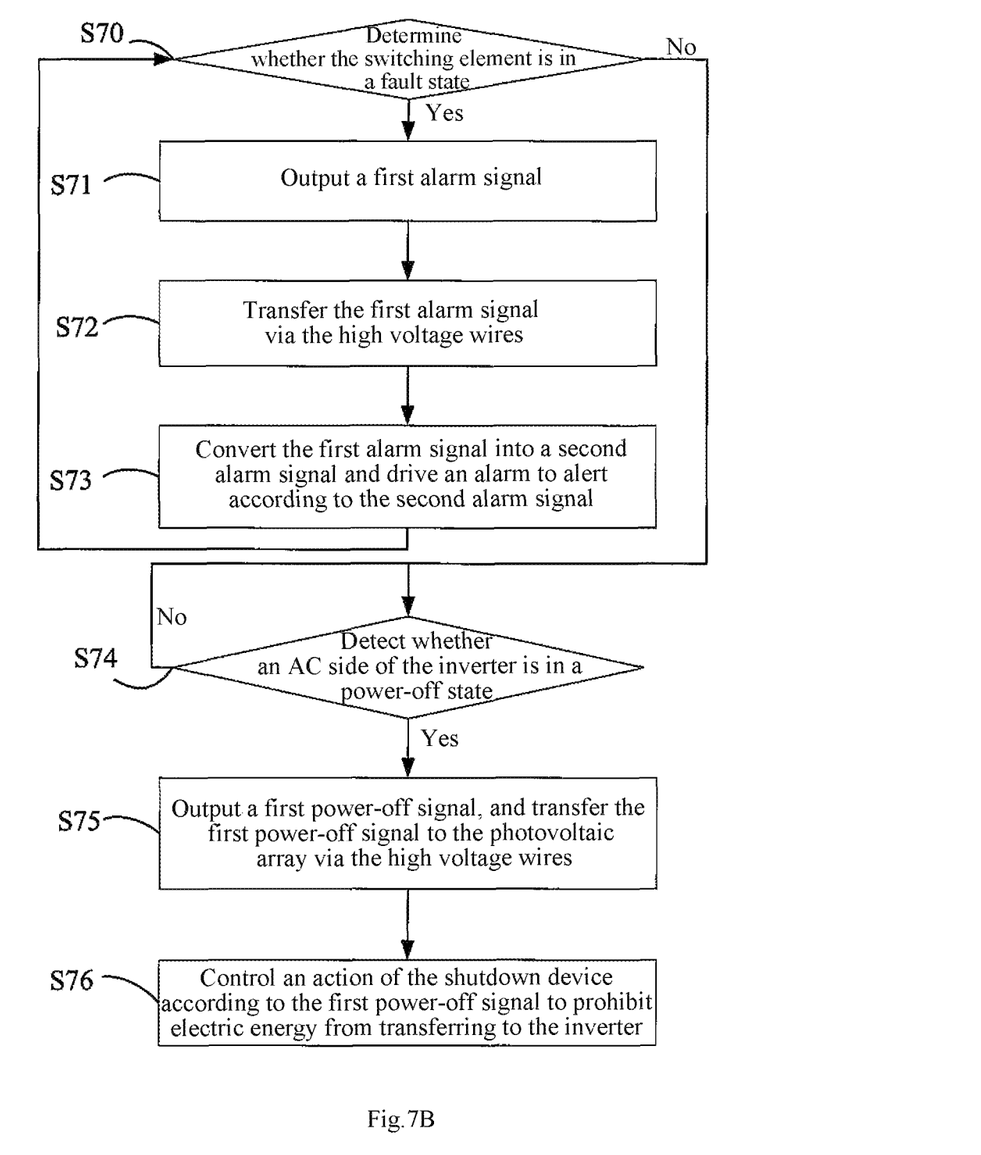
FIG. 7B is a flow chart of a method for shutting down the photovoltaic system according to another embodiment of the present disclosure.

FIG. 7B is a flow chart of a method for shutting down the photovoltaic system according to another embodiment of the present disclosure.

Compared with the shutdown method shown in FIG. 7A, a switching element self-test function is mainly added in the shutdown method shown in the present embodiment.

As shown in FIG. 7B, in step S70, whether a switching element of the shutdown device is in the fault state is determined according to voltage information of the switching element of the shutdown device; when it is determined that the switching element is not in the fault state, steps S74-S76 shown in FIG. 7A are performed directly, wherein the steps S74-S76 have been described in detail in the above embodiments, and will not be elaborated herein. When it is determined that the switching element is in the fault state, the following steps S71-S73 will be performed.

In step S71, a first alarm signal is outputted when the switching element is in the fault state.

In step S72, the first alarm signal is transferred via the high voltage wires.

In step S73, the first alarm signal is converted into a second alarm signal, and an alarm is driven to alert according to the second alarm signal. After repairing the switching element, the process returns to step S70 to determine whether the switching element is in the fault state again, and steps S74-S76 are performed until it is determined that the switching element has no fault.

Through the photovoltaic system in the present embodiment, the power-off/on control signals are transferred to the shutdown device via the high voltage wires, which saves the transmission of the low voltage control signal from the junction box to the PV rapid shutdown device, directly saves the wiring of the low voltage control signal; and there is no high voltage and low voltage wires in the PV rapid shutdown device, thereby it is unnecessary to treat the insulation problem between the high voltage and the low voltage, which greatly simplifies the laying manner of the wires and the design cost, and makes the entire wire system more safe and reliable.

Some embodiments of the present disclosure are explained in combination with the drawings above. The person skilled in the art should understand that the particular structure and process shown in the above particular embodiments are only illustrative, and are not restrictive. Moreover, the person skilled in the art can combine the various technical features shown as above according to various possible manners to constitute new technical solutions, or make other modifications, all of which are within the scope of the present disclosure.

What is claimed is:

1. A photovoltaic system comprising at least one photovoltaic array, a junction box and an inverter, the at least one photovoltaic array transferring electric energy to DC side of the inverter via high voltage wires, AC side of the inverter being coupled to a power grid, and the junction box being electrically connected to the inverter for configuring an input lead wire and an output lead wire of the inverter, wherein the photovoltaic array comprises a photovoltaic array panel and a shutdown device, the shutdown device is electrically connected to the photovoltaic array panel, and is connected to the inverter via the high voltage wires;

the photovoltaic system further comprises a shutdown device controller, which is coupled to the high voltage wires, and is configured for receiving a first detection signal reflecting a state of the AC side of the inverter, determining whether the AC side of the inverter is in a power-off state according to the first detection signal, outputting a first power-off signal when the AC side of the inverter is in the power-off state, and transferring the first power-off signal to the at least one photovoltaic array via the high voltage wires; and the shutdown device of the photovoltaic array is configured for receiving the first power-off signal, and prohibiting the electric energy from transferring to the inverter according to the first power-off signal, wherein the shutdown device controller is installed inside the junction box or outside the junction box, wherein the shutdown device controller comprises:

a first signal terminal configured for receiving the first detection signal reflecting the state of the AC side of the inverter; and a first communication device electrically connected with the first signal terminal, and configured for determining whether the AC side of the inverter is in the power-off state according to the first detection signal, outputting the first power-off signal when the AC side of the inverter is in the power-off state, and loading the first power-off signal on the high voltage wires, wherein the first detection signal is an AC voltage outputted from the AC side of the inverter, and when the AC voltage is less than a second threshold value, the first communication device determines that the AC side is in the power-off state.

2. The photovoltaic system according to claim 1, wherein the first communication device comprises:

a power supply unit connected to the AC side of the inverter and configured for converting alternative current outputted from the AC side into a direct current so as to supply power to the first communication device.

3. The photovoltaic system according to claim 2, wherein the first detection signal is a voltage of the direct current, and when the DC voltage is less than a first threshold value, the first communication device determines that the AC side is in the power-off state.

4. The photovoltaic system according to claim 1, wherein the first communication device comprises:

a first communication controller configured for receiving the first detection signal, determining whether the AC side of the inverter is in the power-off state according to the first detection signal, and outputting a second power-off signal when the AC side is in the power-off state; and a first coupler electrically connected to the first signal terminal and the first communication controller, and configured for filtering a low frequency component of the second power-off signal and generating the first power-off signal.

5. The photovoltaic system according to claim 1, wherein the shutdown device comprises:

a second signal terminal configured for receiving the first power-off signal on the high voltage wires;

a second communication device electrically connected to the second signal terminal and configured for outputting a shutdown control signal according to the first power-off signal; and at least one second switching element installed on the high voltage wires between the photovoltaic array panel and the junction box, a control terminal of the at least one second switching element being connected to an output of the second communication device and configured for disconnecting the photovoltaic array panel and the inverter according to the shutdown control signal.

6. The photovoltaic system according to claim 5, wherein the second communication device comprises:
a second coupler electrically connected to the second signal terminal, and configured for filtering a low frequency component of the first power-off signal and generating a third power-off signal having a same frequency as that of the first power-off signal; and
a second communication controller configured for receiving the third power-off signal and generating the shutdown control signal according to the third power-off signal.

7. The photovoltaic system according to claim 5, wherein the shutdown device further comprises a self-test unit, which determines whether the at least one second switching element is in a fault state according to voltage information of the at least one second switching element, outputs a first alarm signal via the second communication device when the at least one second switching element is in the fault state, transfers the first alarm signal to the first communication device of the shutdown device controller via the high voltage wires, converts the first alarm signal into a second alarm signal, and drives an alarm to alert according to the second alarm signal.

8. The photovoltaic system according to claim 7, wherein the shutdown device comprises two second switching elements, and the two second switching elements are respectively installed at two high voltage wires between the photovoltaic array panel and the junction box; the self-test unit comprises a first voltage detection unit, a second voltage detection unit and a third voltage detection unit, a first terminal and a second terminal of the first voltage detection unit are respectively coupled to the high voltage wires between the photovoltaic array panel and the two second switching elements; a first terminal of the second voltage detection unit is coupled to the high voltage wires between the photovoltaic array panel and one of the second switching elements, and a second terminal of the second voltage detection unit is coupled to the high voltage wires between the other of the second switching elements and the junction box; a first terminal of the third voltage detection unit is coupled to the high voltage wires between the photovoltaic array panel and one of the second switching elements, and a second terminal of the third voltage detection unit is coupled to the high voltage wires between the other of the second switching elements and the junction box; and the first terminal of the second voltage detection unit and the first terminal of the third voltage detection unit are coupled to different high voltage wires.

9. The photovoltaic system according to claim 8, wherein when detecting in an on state of the switching elements, if a first voltage detected by the second voltage detection unit is not equal to a reference voltage detected by the first voltage detection unit, it is determined that one of the second switching elements is in the fault state; and if a second voltage detected by the third voltage detection unit is not equal to the reference voltage detected by the first voltage detection unit, it is determined that the other of the second switching elements is in the fault state.

10. The photovoltaic system according to claim 8, wherein when detecting in an off state of the switching elements, if a first voltage detected by the second voltage detection unit is equal to a reference voltage detected by the first voltage detection unit, it is determined that one of the second switching elements is in the fault state; and if a second voltage detected by the third voltage detection unit is equal to the reference voltage detected by the first voltage detection unit, it is determined that the other of the second switching elements is in the fault state.

11. A method for shutting down a photovoltaic system, the photovoltaic system comprising at least one photovoltaic array, a junction box and an inverter, and the photovoltaic array comprising a photovoltaic array panel and a shutdown device, wherein the method comprises:
detecting whether an AC side of the inverter is in a power-off state according to a first detection signal;
when the AC side of the inverter is in the power-off state, outputting a first power-off signal and transferring the first power-off signal to the at least one photovoltaic array via high voltage wires; and
prohibiting electric energy from transferring to the inverter by controlling an action of the shutdown device according to the first power,
wherein the prohibiting electric energy from transferring to the inverter by controlling the action of the shutdown device according to the first power-off signal comprises:
filtering a low frequency component of the first power-off signal to generate a third power-off signal; and
generating a shutdown control signal according to the third power-off signal to control the action of the shutdown device according to the shutdown control signal, so as to prohibit the electric energy from transferring to the inverter.

12. The method according to claim 11, further comprising:
determining whether a switching element of the shutdown device is in a fault state according to voltage information of the switching element;
when the switching element is in the fault state, outputting a first alarm signal;
transferring the first alarm signal via the high voltage wires; and
converting the first alarm signal into a second alarm signal so as to drive an alarm to alert according to the second alarm signal.

* * * * *